(12) United States Patent
Yang et al.

(10) Patent No.: US 10,317,457 B2
(45) Date of Patent: Jun. 11, 2019

(54) METHOD OF INSPECTING QUALITY OF ORGANIC LIGHT-EMITTING DIODE AND INSPECTING SYSTEM FOR PERFORMING THE METHOD

(71) Applicants: Samsung Display Co., Ltd, Yongin, Gyeonggi-Do (KR); Korea University Research and Business Foundation, Seoul (KR)

(72) Inventors: Jung-Jin Yang, Seoul (KR); Won-Jun Song, Hwaseong-si (KR); Mun-Chae Yoon, Seoul (KR); Gyu-Tae Kim, Seoul (KR); Tae-Woong Yoon, Seoul (KR)

(73) Assignees: Samsung Display Co., Ltd., Yongin-si (KR); Korea University Research and Business Foundation, Seoul (KR)

(*) Notice: Subject to any disclaimer, the term of this patent is extended or adjusted under 35 U.S.C. 154(b) by 404 days.

(21) Appl. No.: 14/697,075

(22) Filed: Apr. 27, 2015

(65) Prior Publication Data
US 2016/0103170 A1    Apr. 14, 2016

(30) Foreign Application Priority Data

Oct. 10, 2014    (KR) ........................ 10-2014-0137014

(51) Int. Cl.
G09G 3/32    (2016.01)
G01R 31/26   (2014.01)
H01L 51/00   (2006.01)

(52) U.S. Cl.
CPC ...... *G01R 31/2635* (2013.01); *H01L 51/0031* (2013.01)

(58) Field of Classification Search
CPC .................................................. G09G 3/3225
(Continued)

(56) References Cited

U.S. PATENT DOCUMENTS 8,242,787 B2   8/2012 Hente et al.
8,878,461 B2   11/2014 Serebryanov et al.
(Continued)

FOREIGN PATENT DOCUMENTS

CN    101169340 A    4/2008
CN    101652669 A    2/2010
(Continued)

OTHER PUBLICATIONS

Li, Y., "Hybrid intelligent approach for modeling and optimization of semiconductor devices and nanostructures," Computational Materials Science, vol. 45, 2009, pp. 41-51.
(Continued)

*Primary Examiner* — Min Huang
(74) *Attorney, Agent, or Firm* — Lewis Roca Rothgerber Christie LLP

(57) ABSTRACT

A method of inspecting the quality of an organic light-emitting diode (OLED) and an inspecting system for performing the method are disclosed. In one aspect, the method includes applying an input voltage to the OLED, measuring an OLED voltage across the OLED and an OLED current flowing through the OLED, estimating a parameter of the OLED based at least in part on the OLED voltage and the OLED current, and extracting a physical characteristic of the OLED based at least in part on the parameter.

18 Claims, 5 Drawing Sheets

(58) Field of Classification Search
USPC .......................................................... 345/76
See application file for complete search history.

(56) References Cited

U.S. PATENT DOCUMENTS

| | | | |
|---|---|---|---|
| 9,161,414 B2 | 10/2015 | Brancken et al. | |
| 9,672,773 B2* | 6/2017 | Zhang | G09G 3/3258 |
| 2003/0184307 A1* | 10/2003 | Kozlowski | B60L 3/0046 |
| | | | 324/427 |
| 2004/0084743 A1* | 5/2004 | VanBuskirk | B82Y 10/00 |
| | | | 257/481 |
| 2005/0057273 A1* | 3/2005 | Lin | G09G 3/006 |
| | | | 324/760.01 |
| 2005/0146281 A1* | 7/2005 | Ricky Ng | G09G 3/3216 |
| | | | 315/169.3 |
| 2006/0012310 A1* | 1/2006 | Chen | G09G 3/3233 |
| | | | 315/169.3 |
| 2006/0232524 A1* | 10/2006 | Cok | H05B 33/0896 |
| | | | 345/82 |
| 2008/0103706 A1 | 5/2008 | Wu et al. | |
| 2009/0027314 A1* | 1/2009 | Kohno | G09G 3/3233 |
| | | | 345/76 |
| 2010/0318252 A1* | 12/2010 | Izumi | B60K 6/365 |
| | | | 701/22 |
| 2013/0046496 A1* | 2/2013 | Chen | G01R 31/2648 |
| | | | 702/65 |
| 2013/0050174 A1* | 2/2013 | Kim | G09G 3/006 |
| | | | 345/212 |
| 2013/0141469 A1* | 6/2013 | Xu | G09G 3/3233 |
| | | | 345/690 |
| 2013/0240840 A1 | 9/2013 | Forrest et al. | |
| 2014/0252992 A1* | 9/2014 | Radermacher | H05B 33/0815 |
| | | | 315/307 |
| 2014/0285407 A1* | 9/2014 | Chaji | G09G 3/3233 |
| | | | 345/76 |
| 2015/0034933 A1* | 2/2015 | Hong | H01L 29/66969 |
| | | | 257/40 |
| 2015/0318401 A1* | 11/2015 | Duan | H01L 29/66742 |
| | | | 250/200 |
| 2016/0212819 A1* | 7/2016 | Eberson | H05B 33/0887 |

FOREIGN PATENT DOCUMENTS

| | | |
|---|---|---|
| CN | 103716972 A | 4/2014 |
| CN | 103954629 A | 7/2014 |
| CN | 203688743 U | 7/2014 |
| KR | 10-0591165 B1 | 6/2006 |
| KR | 10-2014-0044367 A | 4/2014 |

OTHER PUBLICATIONS

Schwaab, M., et al., "Nonlinear parameter estimation through particle swarm optimization," Chemical Engineering Science, vol. 63, 2008, pp. 1542-1552.

* cited by examiner

METHOD OF INSPECTING QUALITY OF ORGANIC LIGHT-EMITTING DIODE AND INSPECTING SYSTEM FOR PERFORMING THE METHOD

CROSS-REFERENCE TO RELATED APPLICATIONS

This application claims priority under 35 U.S.C. § 119 to Korean Patent Application No. 10-2014-0137014, filed on Oct. 10, 2014 in the Korean Intellectual Property Office KIPO, the contents of which are herein incorporated by reference in their entireties.

BACKGROUND

Field

The described technology generally relates to a method of inspecting the quality of an organic light-emitting diode (OLED) and an inspecting system for performing the method.

Description of the Related Technology

Typically, various steps are required to inspect the quality of an OLED. For example, a reverse voltage is applied to the OLED and a reverse saturation current is measured by a current meter. In addition, a voltage-current curve of the OLED is obtained by a voltage meter and a current meter. An ideality factor is obtained using the voltage-current curve by curve fitting. In addition, a carrier lifetime is measured using a photo detector and a time-resolved photoluminescence technology.

SUMMARY OF CERTAIN INVENTIVE ASPECTS

One inventive aspect is a method of inspecting the quality of an OLED having simplified steps by modeling of the OLED and extracting physical characteristics of the OLED.

Another aspect is an inspecting system of an OLED for performing the method.

Another aspect is a method of inspecting an OLED, the method including measuring an OLED voltage which is applied to both ends of the OLED and an OLED current which flows the OLED by applying an input voltage to the OLED, estimating a parameter of the OLED using the OLED voltage and the OLED current and extracting a physical characteristic of the OLED using the parameter.

In an exemplary embodiment, the OLED is modeled by resistors and capacitors.

In an exemplary embodiment, the OLED includes an anode, a hole injecting layer formed on the anode, a hole transport layer formed on the hole injecting layer, a light emitting layer formed on the hole transport layer, an electron transport layer formed on the light emitting layer, an electron injecting layer formed on the electron transport layer and a cathode formed on the electron injecting layer. The modeled OLED can include a parasitic resistance RP connected between a first node and a second node, a diode resistance RD and a diode capacitance CD which are connected between the second node and a third node in parallel and a parasitic capacitance CP connected between the first node and the third node.

In an exemplary embodiment, the parasitic resistance RP is defined as a sum of a resistance of the hole injecting layer, a resistance of the hole transport layer, a resistance of the electron transport layer and a resistance of the electron injecting layer. The parasitic capacitance CP can be defined as a capacitance between the anode and the cathode. The diode resistance RD can be defined as a resistance of the light emitting layer. The diode capacitance CD can be defined as a capacitance of the light emitting layer.

In an exemplary embodiment, the parameter includes a diode resistance constant RD0, a diode capacitance constant CD0, the parasitic resistance RP, the parasitic capacitance CP and a characteristic value a. When a voltage of the light emitting layer is VD, the diode resistance can be $$RD = \frac{RD0}{e^{aVD}},$$

and the diode capacitance can be $CD = CD0 \times e^{aVD}$.

In an exemplary embodiment, the estimating the parameter of the OLED uses a fitness function of a plurality of parameter candidate vectors. The fitness function can be defined as a difference between the measured OLED voltage and an estimated OLED voltage, the estimated OLED voltage being estimated using the parameter candidate vector.

In an exemplary embodiment, when the θi is the parameter candidate vector, t is a time, IOLED is the OLED current, VOLED is the measured OLED voltage and $\hat{V}OLED$ is the estimated OLED voltage using the parameter candidate vector, the fitness function h is defined as $$h(\theta i, IOLED) = -\sum_t |VOLED(t, IOLED) - \hat{V}OLED(t, \theta i, IOLED)|^2.$$

In an exemplary embodiment, the estimated OLED voltage $\hat{V}OLED$ is estimated with the following equations:

$$\frac{d\hat{V}OLED}{dt} = \frac{IOLED}{CP} - \frac{\hat{V}OLED - VD}{RP \times CP} \text{ and}$$

$$\frac{dVD}{dt} = \frac{\hat{V}OLED - VD}{RP \times CD0(1 + aVD)e^{aVD}} - \frac{VD}{RD0 \times CD0(1 + aVD)}.$$

In an exemplary embodiment, the estimating the parameter of the OLED includes selecting P first parameter candidate vectors having high fitness functions from N initial parameter candidate vectors, P and N being positive integers, N being greater than P, selecting N-P second parameter candidate vectors on lines connecting the first parameter candidate vectors and selecting an optimal vector having highest fitness function from the first and second parameter candidate vectors.

In an exemplary embodiment, the estimating the parameter of the OLED includes repetitively selecting the optimal vector having highest fitness function from the N initial parameter candidate vectors and deciding a final vector from the optimal vectors.

In an exemplary embodiment, the physical characteristic of the OLED includes a reverse saturation current ISO. The reverse saturation current ISO can be $$IS0 = \frac{RD0}{a}.$$

In an exemplary embodiment, the physical characteristic of the OLED includes an ideal factor n. When Boltzmann constant and T is an absolute temperature, the ideal factor n can be $$n = \frac{1}{akT}.$$

In an exemplary embodiment, the physical characteristic of the OLED includes a carrier lifetime τm. The carrier lifetime τm can be τm=RD0×CD0.

In an exemplary embodiment, a load resistor is connected to the OLED in series to measure the OLED voltage and the OLED current.

Another aspect is an inspecting system of an OLED, the inspecting system including a load resistor, a data collecting module and a processor. The load resistor is connected to the OLED in series. The data collecting module is configured to apply an input voltage to the OLED and to measure at least one of an OLED voltage which is applied to both ends of the OLED and an OLED current which flows the OLED. The processor is configured to estimate a parameter of the OLED using the OLED voltage and the OLED current and to extract a physical characteristic of the OLED using the parameter.

In an exemplary embodiment, the OLED is modeled by resistors and capacitors.

In an exemplary embodiment, the OLED includes an anode, a hole injecting layer formed on the anode, a hole transport layer formed on the hole injecting layer, a light emitting layer formed on the hole transport layer, an electron transport layer formed on the light emitting layer, an electron injecting layer formed on the electron transport layer and a cathode formed on the electron injecting layer. The modeled OLED can include a parasitic resistance RP connected between a first node and a second node, a diode resistance RD and a diode capacitance CD which are connected between the second node and a third node in parallel and a parasitic capacitance CP connected between the first node and the third node.

In an exemplary embodiment, the parasitic resistance RP is defined as a sum of a resistance of the hole injecting layer, a resistance of the hole transport layer, a resistance of the electron transport layer and a resistance of the electron injecting layer. The parasitic capacitance CP can be defined as a capacitance between the anode and the cathode. The diode resistance RD can be defined as a resistance of the light emitting layer. The diode capacitance CD can be defined as a capacitance of the light emitting layer.

In an exemplary embodiment, the parameter includes a diode resistance constant RD0, a diode capacitance constant CD0, the parasitic resistance RP, the parasitic capacitance CP and a characteristic value a. When a voltage of the light emitting layer is VD, the diode resistance can be $$RD = \frac{RD0}{e^{aVD}},$$

and the diode capacitance can be CD=CD0×$e^{aVD}$.

In an exemplary embodiment, the processor is configured to estimate the parameter of the OLED using a fitness function of a plurality of parameter candidate vectors. The fitness function can be defined as a difference between the measured OLED voltage and an estimated OLED voltage, the estimated OLED voltage being estimated using the parameter candidate vector.

In an exemplary embodiment, when the θi is the parameter candidate vector, t is a time, IOLED is the OLED current, VOLED is the measured OLED voltage and V̂OLED is the estimated OLED voltage using the parameter candidate vector, the fitness function h is defined as $$h(\theta i, IOLED) = -\sum_t |VOLED(t, IOLED) - \hat{V}OLED(t, \theta i, IOLED)|^2.$$

In an exemplary embodiment, the processor is configured to select P first parameter candidate vectors having high fitness functions from N initial parameter candidate vectors, P and N being positive integers, N being greater than P, to select N-P second parameter candidate vectors on lines connecting the first parameter candidate vectors and to select an optimal vector having highest fitness function from the first and second parameter candidate vectors.

Another aspect is a method of inspecting the quality of an organic light-emitting diode (OLED), the method comprising applying an input voltage to the OLED, measuring an OLED voltage across the OLED and an OLED current flowing through the OLED, estimating a parameter of the OLED based at least in part on the OLED voltage and the OLED current, and extracting a physical characteristic of the OLED based at least in part on the parameter.

In the above method, a model of the OLED includes one or more resistors and one or more capacitors.

In the above method, the OLED includes an anode, a hole injecting layer formed over the anode, a hole transport layer formed over the hole injecting layer, a light emitting layer formed over the hole transport layer, an electron transport layer formed over the light emitting layer, an electron injecting layer formed over the electron transport layer, and a cathode formed over the electron injecting layer, wherein each layer has a resistance, wherein the OLED model includes i) a parasitic resistance RP electrically connected between a first node and a second node, ii) a diode resistance RD and a diode capacitance CD which are electrically connected in parallel between the second node and a third node, and iii) a parasitic capacitance CP electrically connected between the first node and the third node.

In the above method, the parasitic resistance RP is defined as the sum of the resistances of the hole injecting layer, the hole transport layer, the electron transport layer, and the electron injecting layer, wherein the parasitic capacitance CP is defined as a capacitance between the anode and the cathode, wherein the diode resistance RD is defined as a resistance of the light emitting layer, and wherein the diode capacitance CD is defined as a capacitance of the light emitting layer.

In the above method, the parameter includes a diode resistance constant RD0, a diode capacitance constant CD0, the parasitic resistance RP, the parasitic capacitance CP, and a characteristic value a, wherein a voltage of the light emitting layer is VD, the diode resistance is $$RD = \frac{RD0}{e^{aVD}},$$

and the diode capacitance is CD=CD0×$e^{aVD}$.

In the above method, the estimating is performed based at least in part on a fitness function of a plurality of parameter candidate vectors, wherein the fitness function is defined as the difference between the measured OLED voltage and an estimated OLED voltage, and wherein the estimated OLED voltage is estimated based at least in part on the parameter candidate vector.

In the above method, θi is the parameter candidate vector, t is time, IOLED is the OLED current, VOLED is the measured OLED voltage, and V̂OLED is the estimated OLED voltage using the parameter candidate vector, wherein the fitness function h is defined as $$h(\theta i, IOLED) = -\sum_{t} |VOLED(t, IOLED) - \hat{V}OLED(t, \theta i, IOLED)|^2.$$

In the above method, the estimated OLED voltage V̂OLED is estimated based on the following equations $$\frac{d\hat{V}OLED}{dt} = \frac{IOLED}{CP} - \frac{\hat{V}OLED - VD}{RP \times CP} \text{ and}$$

$$\frac{dVD}{dt} = \frac{\hat{V}OLED - VD}{RP \times CD0(1 + aVD)e^{aVD}} - \frac{VD}{RD0 \times CD0(1 + aVD)}.$$

In the above method, the estimating comprises selecting P first parameter candidate vectors having fitness functions from N initial parameter candidate vectors, wherein the P and N are positive integers, and wherein N is greater than P. In the above method, the also estimating comprises selecting N-P second parameter candidate vectors on lines connecting the first parameter candidate vectors and selecting an optimal vector having the greatest fitness function from the first and second parameter candidate vectors.

In the above method, the estimating further comprises repetitively selecting the optimal vector having the greatest fitness function from the N initial parameter candidate vectors. In the above method, the estimating further comprises determining a final vector from the optimal vectors.

In the above method, the physical characteristic of the OLED is a reverse saturation current IS0, wherein the reverse saturation current IS0 is $$IS0 = \frac{RD0}{a}.$$

In the above method, the physical characteristic is an ideal factor n, wherein when k is the Boltzmann constant and T is an absolute temperature, the ideal factor n is $$n = \frac{1}{akT}.$$

In the above method, the physical characteristic is a carrier lifetime τm, wherein the carrier lifetime τm is τm=RD0×CD0.

In the above method, a load resistor is electrically connected to the OLED in series so as to measure the OLED voltage and the OLED current.

Another aspect is an inspecting system of an organic light-emitting diode (OLED), the inspecting system comprising a load resistor electrically connected to the OLED in series, a data collector configured to apply an input voltage to the OLED and measure at least one of an OLED voltage across the OLED and an OLED current flowing through the OLED, and a processor configured to i) estimate a parameter of the OLED based at least in part on the OLED voltage and the OLED current and ii) extract a physical characteristic of the based at least in part on the parameter.

In the above system, a model of the OLED includes one or more resistors and one or more capacitors.

In the above system, the OLED includes an anode, a hole injecting layer formed over the anode, a hole transport layer formed over the hole injecting layer, a light emitting layer formed over the hole transport layer, an electron transport layer formed over the light emitting layer, an electron injecting layer formed over the electron transport layer and a cathode formed over the electron injecting layer, wherein each layer has a resistance, wherein the OLED model includes i) a parasitic resistance RP electrically connected between a first node and a second node, ii) a diode resistance RD and a diode capacitance CD which are electrically connected in parallel between the second node and a third node, and iii) a parasitic capacitance CP electrically connected between the first node and the third node.

In the above system, the parasitic resistance RP is defined as the sum of the resistances of the hole injecting layer, the hole transport layer, the electron transport layer, and the electron injecting layer, wherein the parasitic capacitance CP is defined as a capacitance between the anode and the cathode, wherein the diode resistance RD is defined as a resistance of the light emitting layer, and wherein the diode capacitance CD is defined as a capacitance of the light emitting layer.

In the above system, the parameter includes a diode resistance constant RD0, a diode capacitance constant CD0, the parasitic resistance RP, the parasitic capacitance CP, and a characteristic value a, wherein a voltage of the light emitting layer is VD, the diode resistance is $$RD = \frac{RD0}{e^{aVD}},$$

and the diode capacitance is $CD=CD0 \times e^{aVD}$.

In the above system, the processor is further configured to estimate the parameter based at least in part on a fitness function of a plurality of parameter candidate vectors, wherein the fitness function is defined as the difference between the measured OLED voltage and an estimated OLED voltage, and wherein the processor is further configured to estimate the estimated OLED voltage based at least in part on the parameter candidate vector.

In the above system, θi is the parameter candidate vector, t is time, IOLED is the OLED current, VOLED is the measured OLED voltage, and V̂OLED is the estimated OLED voltage based at least in part on the parameter candidate vector, wherein the fitness function h is defined as $$h(\theta i, IOLED) = -\sum_{t} |VOLED(t, IOLED) - \hat{V}OLED(t, \theta i, IOLED)|^2.$$

In the above system, the processor is further configured to i) select P first parameter candidate vectors having fitness functions from N initial parameter candidate vectors, wherein P and N are positive integers, wherein N is greater than P, ii) select N-P second parameter candidate vectors on lines connecting the first parameter candidate vectors, and iii) select an optimal vector having the greatest fitness function from the first and second parameter candidate vectors.

According to at least one of the disclosed embodiments, the OLED is modeled and the parameter of the modeled OLED is estimated and the physical characteristics of the OLED is extracted. Thus, the OLED is inspected in simplified steps so that the cost and time for inspecting the OLED can be reduced.

In addition, the manufacturing cost of a display device including the OLED is reduced and reliability of the display device can be improved.

DETAILED DESCRIPTION OF CERTAIN INVENTIVE EMBODIMENTS

Typical methods of inspecting the quality of OLEDs require increased costs and take a relatively long time, as data used for inspection is obtained through multiple steps.

Hereinafter, the described technology will be explained in detail with reference to the accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
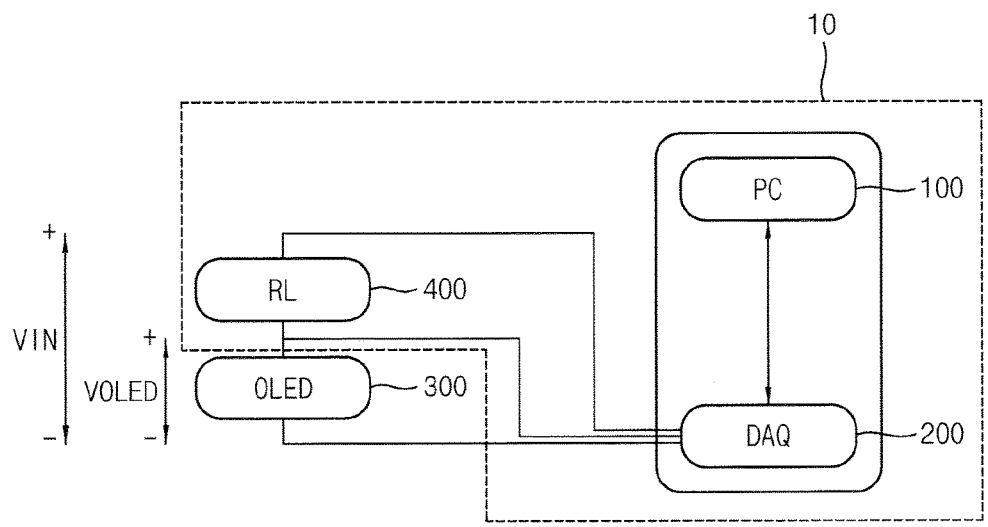
FIG. 1 is a block diagram illustrating an inspecting system of an OLED according to an exemplary embodiment.

FIG. 1 is a block diagram illustrating an inspecting system of an OLED according to an exemplary embodiment.

Referring to FIG. 1, the inspecting system 10 of an OLED includes a data collecting module or data collector 200, a processor 100 and a load resistor RL 400.

The data collecting module 200 applies an input voltage VIN to the OLED 300. The input voltage VIN can vary according to time. For example, the input voltage VIN is a pseudorandom binary sequence signal.

The data collecting module 200 can measure at least one of an OLED voltage VOLED, which is applied both ends of the OLED 300, and an OLED current IOLED, which flows through the OLED 300 using the load resistor RL.

The load resistor RL 400 is connected to the OLED 300 in series. The load resistor RL 400 can be connected between the OLED 300 and the data collecting module 200.

In some embodiments, the data collecting module 200 measures the OLED voltage VOLED which is applied to both ends of the OLED 300. The OLED current IOLED can be calculated using the input voltage VIN and the OLED voltage VOLED. The OLED current IOLED can be calculated using Equation 1.

$$IOLED = \frac{VIN - VOLED}{RL} \quad \text{Equation 1}$$

The processor 100 estimates parameters of the OLED 300 using the OLED current IOLED and the OLED voltage VOLED. The processor 100 extracts physical characteristics of the OLED 300 using the parameter.

Figure 2:
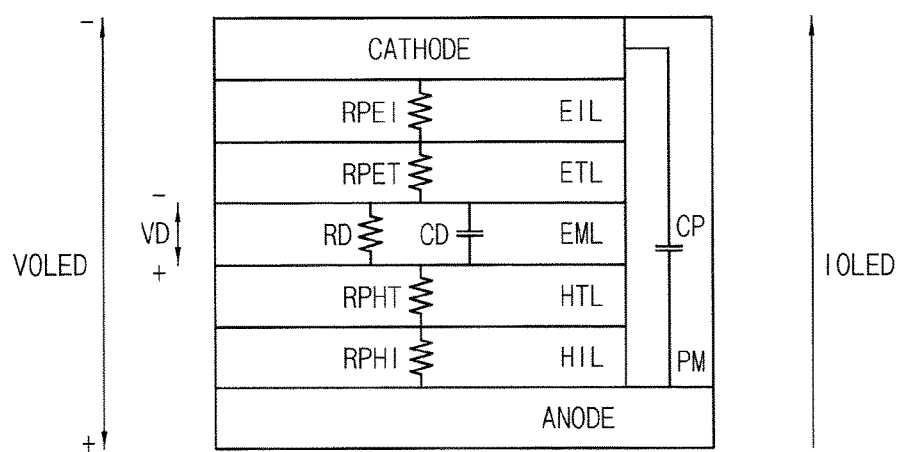
FIG. 2 is a cross sectional view illustrating the OLED of FIG. 1.
Figure 3:
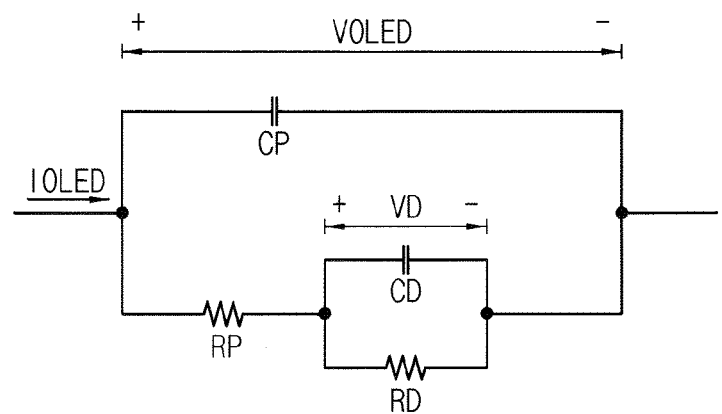
FIG. 3 is a circuit diagram illustrating the OLED of FIG. 1 which is modeled by resistors and capacitors.
Figure 4:
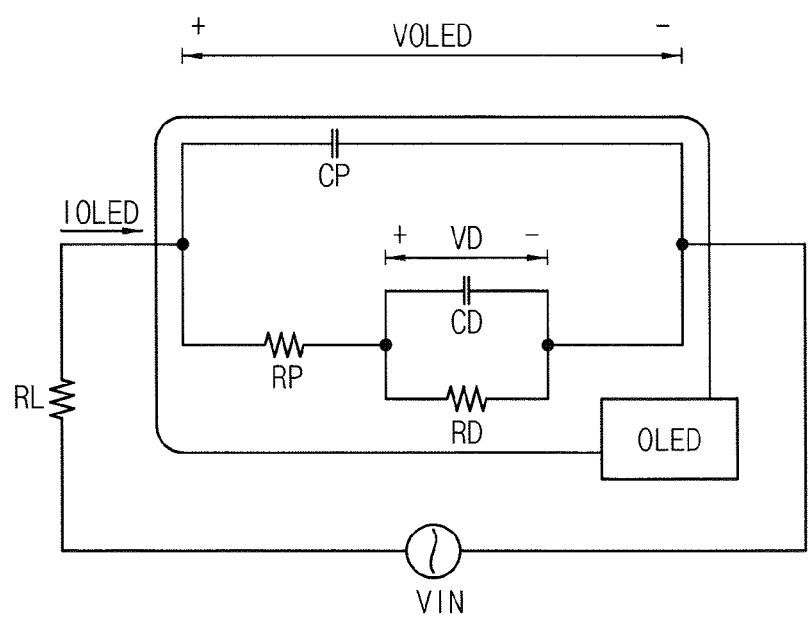
FIG. 4 is a circuit diagram illustrating the OLED of FIG. 1 and the inspecting system of the OLED of FIG. 1.

FIG. 2 is a cross sectional view illustrating the OLED 300 of FIG. 1. FIG. 3 is a circuit diagram illustrating the OLED 300 of FIG. 1 which is modeled by resistors and capacitors. FIG. 4 is a circuit diagram illustrating the OLED 300 of FIG. 1 and the inspecting system of the OLED of FIG. 1.

Referring to FIGS. 1 to 4, the OLED 300 includes an anode, a hole injecting layer HIL formed on the anode, a hole transport layer HTL formed on the hole injecting layer HIL, a light emitting layer EML formed on the hole transport layer HTL, an electron transport layer ETL formed on the light emitting layer EML, an electron injecting layer EIL formed on the electron transport layer ETL and a cathode formed on the electron injecting layer EIL.

Referring to FIG. 3, the OLED 300 is modeled by resistors and capacitors. For example, the modeled OLED 300 includes a parasitic resistance RP connected between a first node and a second node, a diode resistance RD and a diode capacitance CD which are connected in parallel between the second node and a third node, and a parasitic capacitance CP connected between the first node and the third node.

The parasitic resistance RP is defined as a sum of a resistance RPHI of the hole injecting layer, a resistance RPHT of the hole transport layer, a resistance RPET of the electron transport layer and a resistance RPEI of the electron injecting layer.

The parasitic capacitance CP is defined as a capacitance between the anode and the cathode. For example, the parasitic capacitance CP represents a parasitic capacitance of packaging material PM surrounding the anode and the cathode.

The light emitting layer EML can be represented as a first order RC circuit. The light emitting layer EML is represented as the diode resistance RD and the diode capacitance CD connected in parallel. The diode resistance RD is a resistance of the light emitting layer EML. The diode capacitance CD is a capacitance of the light emitting layer EML.

The voltage across the light emitting layer EML is VD. The voltage across the OLED is VOLED. The current flowing through the OLED is IOLED.

The processor 100 can estimate the parameter of the OLED 300 using the OLED current IOLED and the OLED voltage VOLED. For example, the processor 100 estimates the parameter using particle swarm optimization ("PSO").

The parameter can include a diode resistance constant RD0, a diode capacitance constant CD0, the parasitic resistance RP, the parasitic capacitance CP and a characteristic value a. The diode resistance RD and the diode resistance constant RD0 have a relationship as in Equation 2. The diode capacitance CD and the diode capacitance constant CD0 have a relationship as in Equation 3.

$$RD = \frac{RD0}{e^{aVD}} \quad \text{Equation 2}$$

$$CD = CD0 \times e^{aVD} \quad \text{Equation 3}$$

The processor 100 can estimate the parameter using a fitness function of a plurality of parameter candidate vectors. The parameter candidate vector can be determined using Equation 4.

$$\theta = [CD0 \ RD0 \ RP \ CP \ a] \quad \text{Equation 4}$$

The processor 100 selects P first parameter candidate vectors among N initial parameter candidate vectors. Herein P and N are positive integers. N can be greater than P. The processor 100 can select N-P second parameter candidate vectors on lines connecting the first parameter candidate vectors. The processor 100 can determine an optimal vector having highest fitness function among the first and second parameter candidate vectors to estimate the parameter.

The processor 100 can repetitively decide optimal vectors from N initial parameter candidate vectors as explained above and the processor 100 can select a final vector from the optimal vectors to estimate the parameter.

A method of estimating the parameter is explained referring to FIGS. 6A to 6D in detail.

θi is a parameter candidate vector. t is time. IOLED is the OLED current. VOLED is the OLED voltage. $\hat{V}$OLED is the estimated OLED voltage. The fitness function h is defined as Equation 5.

$$h(\theta i, IOLED) = -\sum_{t} |VOLED(t, IOLED) - \hat{V}OLED(t, \theta i, IOLED)|^2 \quad \text{Equation 5}$$

In Equation 5, VOLED(t, IOLED) means the OLED voltage VOLED varies according to the time (t) which is measured by the data collecting module 200. When a parameter candidate vector is θi and the OLED current is IOLED, $\hat{V}$OLED (t, θi, IOLED) means the estimated OLED voltage varies according to the time and is non-linearly modeled.

Squares of absolute values of the difference between the measured OLED voltage and the estimated OLED voltage using the parameter candidate vector θi are summed over time and multiplied by −1. Then, the fitness function of the parameter candidate vector θi is obtained.

The fitness function of the parameter candidate vector θi has a negative value. When the fitness function h increases (the fitness function h gets closer to zero), the parameter candidate vector θi is close to characteristics of a real OLED.

The estimated OLED voltage $\hat{V}$OLED can be calculated using Equations 6 and 7. Equations 6 and 7 are differential equations respectively calculated at the first node and the second node by Kirchhoff's current law ("KCL").

$$\frac{d\hat{V}OLED}{dt} = \frac{IOLED}{CP} - \frac{\hat{V}OLED - VD}{RP \times CP} \quad \text{Equation 6}$$

$$\frac{dVD}{dt} = \frac{\hat{V}OLED - VD}{RP \times CD0(1 + aVD)e^{aVD}} - \frac{VD}{RD0 \times CD0(1 + aVD)} \quad \text{Equation 7}$$

The processor 100 extracts the physical characteristics of the OLED 300 using the parameters RD0, CD0, RP, CP and a.

The physical characteristic of the OLED 300 can be a reverse saturation current ISO. As the reverse saturation current ISO increases, a leakage current of the OLED 300 increases. Thus, in some embodiments, when the reverse saturation current ISO of the OLED 300 is substantially equal to or greater than a first threshold, the OLED 300 fails the quality test. The reverse saturation current ISO is defined as in Equation 8.

$$ISO = \frac{RD0}{a} \quad \text{Equation 8}$$

In a typical method of inspecting the OLED, the reverse saturation current is directly measured by a current meter when a reverse voltage is applied to the OLED. According to the present exemplary embodiment, the reverse saturation current ISO of the OLED is easily obtained by the parameter estimation.

The physical characteristic of the OLED 300 can be an ideal factor n. As the ideal factor n of the OLED 300 increases, the driving voltage of the OLED 300 increases. Thus, in some embodiments, when the ideal factor n of the OLED 300 is substantially equal to or greater than a second threshold, the OLED 300 fails the quality test. When k is Boltzmann constant and T is an absolute temperature, the ideal factor n is defined as in Equation 9.

$$n = \frac{1}{akT} \quad \text{Equation 9}$$

In a typical method of inspecting the OLED, the voltage-current curve is obtained using a voltage meter and a current meter or using an impedance meter. Then the ideal factor n is obtained using the voltage-current curve by curve fitting. According to the present exemplary embodiment, the ideal factor n of the OLED is easily obtained by the parameter estimation.

The physical characteristic of the OLED 300 can be a carrier lifetime τm. As carrier lifetime τm of the OLED 300 increases, a turn-on time and a turn-off time of the OLED 300 increases. Thus, in some embodiments, when the carrier lifetime τm of the OLED 300 is substantially equal to or greater than a third threshold, the OLED 300 fails the quality test. The carrier lifetime τm is defined as in Equation 10.

$$\tau m = RD0 \times CD0 \quad \text{Equation 10}$$

In a typical method of inspecting the OLED, the carrier lifetime τm is measured using a photo detector and a time-resolved photoluminescence technology. According to the present exemplary embodiment, the carrier lifetime τm of the OLED is easily obtained by the parameter estimation.

According to the present exemplary embodiment, all of the reverse saturation current ISO, the ideal factor n and the carrier lifetime τm of the OLED are obtained by the parameter estimation. Thus, the quality of the OLED is inspected in simplified steps so that the cost and time for inspecting the OLED can be reduced. In addition, the manufacturing cost of a display device including the OLED is reduced and a reliability of the display device can be improved.

Figure 5:
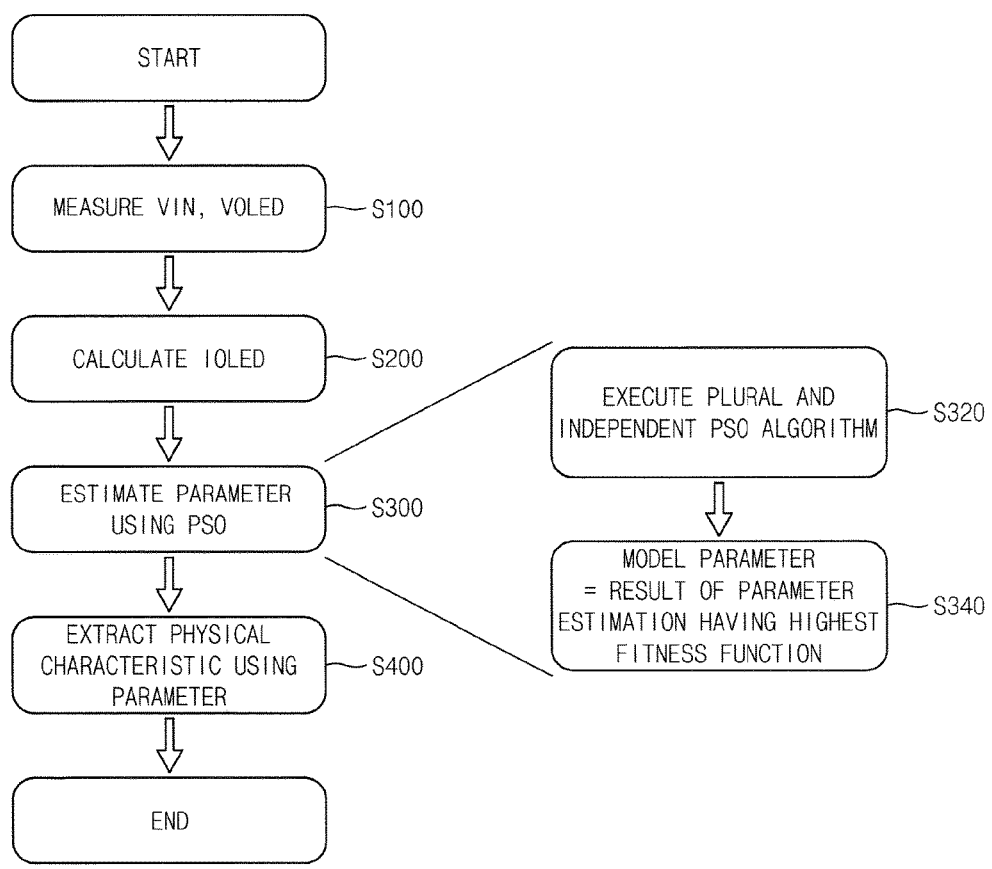
FIG. 5 is a flowchart illustrating a method of inspecting the OLED of FIG. 1.
Figure 6A:
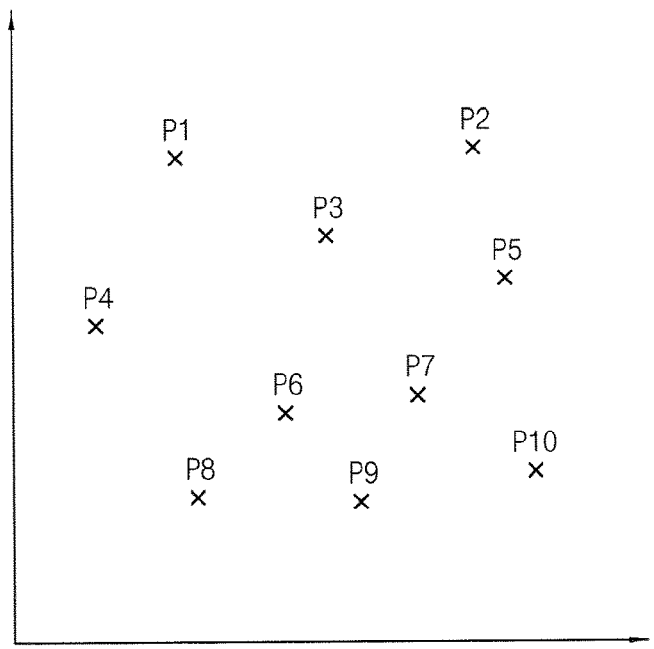
FIGS. 6A and 6D are conceptual diagrams illustrating the step of estimating the parameter of FIG. 5.

FIG. 5 is a flowchart illustrating a method of inspecting the OLED 300 of FIG. 1. FIGS. 6A and 6D are conceptual diagrams illustrating the step of estimating the parameter of FIG. 5.

In some embodiments, the FIG. 5 procedure is implemented in a conventional programming language, such as C or C++ or another suitable programming language. The program can be stored on a computer accessible storage medium of the inspecting system 10, for example, a memory (not shown) of the inspecting system 10 or processor 100. In certain embodiments, the storage medium includes a random access memory (RAM), hard disks, floppy disks, digital video devices, compact discs, video discs, and/or other optical storage mediums, etc. The program can be stored in the processor. The processor can have a configuration based on, for example, i) an advanced RISC machine (ARM) microcontroller and ii) Intel Corporation's microprocessors (e.g., the Pentium family microprocessors). In certain embodiments, the processor is implemented with a variety of computer platforms using a single chip or multichip microprocessors, digital signal processors, embedded microprocessors, microcontrollers, etc. In another embodiment, the processor is implemented with a wide range of operating systems such as Unix, Linux, Microsoft DOS, Microsoft Windows 8/7/Vista/2000/9x/ME/XP, Macintosh OS, OS X, OS/2, Android, iOS and the like. In another embodiment, at least part of the procedure can be implemented with embedded software. Depending on the embodiment, additional states can be added, others removed, or the order of the states changed in FIG. 5.

Referring to FIGS. 1 to 6D, the input voltage VIN is applied to the OLED 300 and the OLED voltage which is applied both ends of the OLED 300 is measured (S100).

The OLED current is calculated using the input voltage VIN and the OLED voltage VOLED (S200).

The parameter is estimated based on the OLED voltage VOLED and the OLED current IOLED using the fitness function h (S300).

The processor 100 can estimate the fitness functions of the parameter candidate vectors. For example, the number of the initial parameter candidate vectors is N.

In FIG. 6A, coordinates P1 to P10 of the initial parameter candidate vectors are represented in a space. For example N is 10 in FIG. 6A.

Figure 6B:
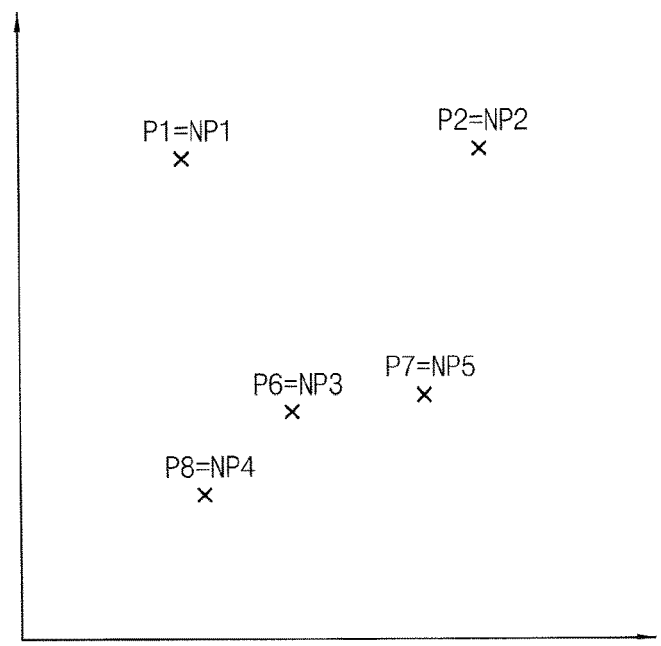

In FIG. 6B, P first parameter candidate vectors NP1, NP2, NP3, NP4 and NP5 which have high fitness function h are selected from N initial parameter candidate vectors. For example, P is 5 in FIG. 6B.

Figure 6C:
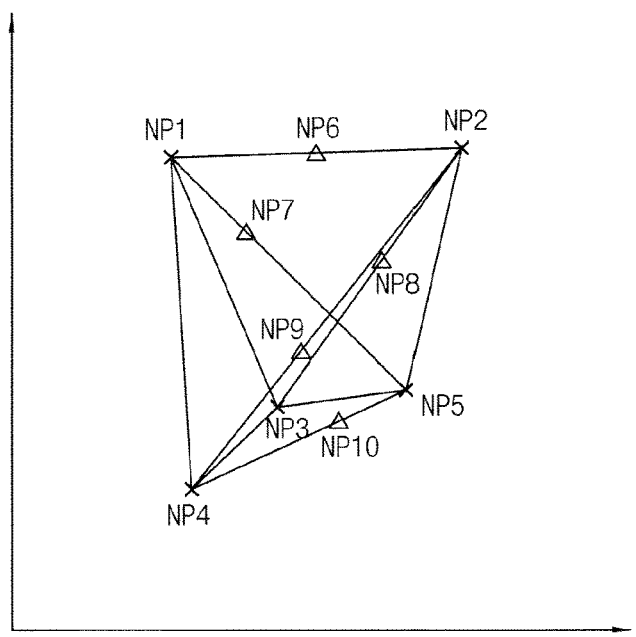
Figure 6D:
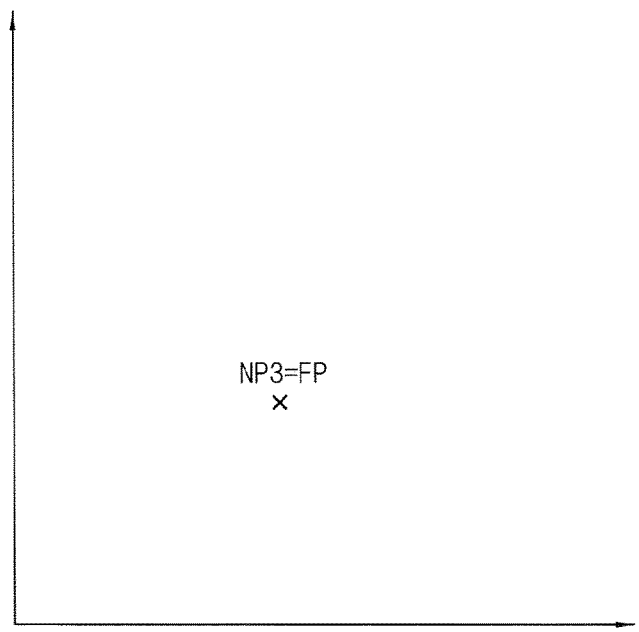

In FIG. 6C, N-P second parameter candidate vectors NP6, NP7, NP8, NP9 and NP10 can be randomly selected on lines connecting the first parameter candidate vectors NP1 to NP5. For example, N-P second parameter candidate vectors NP6 to NP10 are selected on random lines connecting the first parameter candidate vectors NP1 to NP5 from all lines connecting the first parameter candidate vectors NP1 to NP5. The second parameter candidate vector θx is defined as in Equation 11.

$$\theta x = \lambda \theta j + (1-\lambda) \theta i \qquad \text{Equation 11}$$

x is P+1, P+2, . . . , N. i and j are respectively 1, 2, . . . , P.

Alternatively, the second parameter candidate vector θx can be selected near the lines (not on the lines) connecting the first parameter candidate vectors NP1 to NP5 considering mutation.

In FIG. 6D, an optimal vector (NP3=FP) having highest fitness function is selected from the first parameter candidate vectors and the second parameter candidate vectors.

A process in FIGS. 6A to 6D explains a single PSO algorithm. The processor 100 can execute a plurality of PSO algorithms (S320). The PSO algorithms can be independent from one another. The processor 100 can repetitively decide optimal vectors FP from N initial parameter candidate vectors as explained above.

The processor 100 can select a final vector which has the highest fitness function h from the optimal vectors FP generated by the plural PSO algorithms (S340).

Using the parameters, the physical characteristics of the OLED 300 is extracted (S400). The physical characteristics of the OLED 300 can include the reverse saturation current IS0, the ideal factor n and the carrier lifetime τm.

According to the present exemplary embodiment, all of the reverse saturation current IS0, the ideal factor n and the carrier lifetime τm of the OLED are obtained by the parameter estimation. Thus, the quality of the OLED is inspected in simplified steps so that the cost and time for inspecting the OLED can be reduced. In addition, the manufacturing cost of a display device including the OLED is reduced and the reliability of the display device can be improved.

According to the present exemplary embodiment, the cost and time for inspecting the OLED can be reduced. In addition, the manufacturing cost of a display device including the OLED is reduced and a reliability of the display device can be improved.

The foregoing is illustrative of the inventive technology and is not to be construed as limiting thereof. Although a few exemplary embodiments of the inventive concept have been described, those skilled in the art will readily appreciate that many modifications are possible in the exemplary embodiments without materially departing from the novel teachings and advantages of the present inventive concept. Accordingly, all such modifications are intended to be included within the scope of the inventive concept as defined in the claims. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A method of inspecting the quality of an organic light-emitting diode (OLED) with a computerized inspection system, the method comprising:
  applying, using a data collecting module of the inspection system, an input voltage to the OLED;
  measuring, by the data collecting module of the inspection system, an OLED voltage across the OLED and an OLED current flowing through the OLED using a load resistor connected between the OLED and the data collecting module;
  estimating, using the computer processor of the inspection system, an OLED voltage, wherein the estimated OLED voltage is based at least in part on a parameter candidate vector,
  estimating, using the computer processor of the inspection system, a parameter of the OLED based at least in part on the OLED voltage and the OLED current measured, wherein estimating the parameter is based at least in part on a fitness function of a plurality of parameter candidate vectors, wherein the fitness function is defined as a difference between the measured OLED voltage and an estimated OLED voltage; and
  extracting a physical characteristic of the OLED based at least in part on the estimated parameter,
  wherein θi is the parameter candidate vector, t is time, IOLED is the measured OLED current, VOLED is the measured OLED voltage, and $\hat{V}$OLED is the estimated OLED voltage using the parameter candidate vector, and wherein the fitness function h is defined as $$h(\theta i, IOLED) = -\sum_{t} |VOLED(t, IOLED) - \hat{V}OLED(t, \theta i, IOLED)|^2.$$

2. The method of claim 1, wherein a model of the OLED includes one or more resistors and one or more capacitors.

3. The method of claim 2, wherein the OLED includes an anode, a hole injecting layer formed over the anode, a hole transport layer formed over the hole injecting layer, a light emitting layer formed over the hole transport layer, an electron transport layer formed over the light emitting layer, an electron injecting layer formed over the electron transport layer, and a cathode formed over the electron injecting layer, wherein each layer has a resistance, and wherein the OLED model includes i) a parasitic resistance RP electrically connected between a first node and a second node, ii) a diode resistance RD and a diode capacitance CD which are electrically connected in parallel between the second node and a third node, and iii) a parasitic capacitance CP electrically connected between the first node and the third node.

4. The method of claim 3, wherein the parasitic resistance RP is defined as the sum of the resistances of the hole injecting layer, the hole transport layer, the electron transport layer, and the electron injecting layer, wherein the parasitic capacitance CP is defined as a capacitance between the anode and the cathode, wherein the diode resistance RD is defined as a resistance of the light emitting layer, and wherein the diode capacitance CD is defined as a capacitance of the light emitting layer.

5. The method of claim 3, wherein the parameter includes a diode resistance constant RD0, a diode capacitance constant CD0, the parasitic resistance RP, the parasitic capacitance CP, and a characteristic value a, and wherein a voltage of the light emitting layer is VD, the diode resistance is $$RD = \frac{RD0}{e^{aVD}},$$

and the diode capacitance is $CD = CD0 \times e^{aVD}$.

6. The method of claim 1, wherein the OLED includes an anode, a hole injecting layer formed over the anode, a hole transport layer formed over the hole injecting layer, a light emitting layer formed over the hole transport layer, an electron transport layer formed over the light emitting layer, an electron injecting layer formed over the electron transport layer, and a cathode formed over the electron injecting layer, wherein each layer has a resistance, and wherein the OLED model includes i) a parasitic resistance RP electrically connected between a first node and a second node, ii) a diode resistance RD and a diode capacitance CD which are electrically connected in parallel between the second node and a third node, and iii) a parasitic capacitance CP electrically connected between the first node and the third node, wherein the parameter includes a diode resistance constant RD0, a diode capacitance constant CD0, the parasitic resistance RP, the parasitic capacitance CP, and a characteristic value a, and wherein a voltage of the light emitting layer is VD, the diode resistance is $$RD = \frac{RD0}{e^{aVD}},$$

and the diode capacitance is $CD = CD0 \times e^{aVD}$, and wherein the estimated OLED voltage $\hat{V}OLED$ is estimated on the following equations:

$$\frac{d\hat{V}OLED}{dt} = \frac{IOLED}{CP} - \frac{\hat{V}OLED - VD}{RP \times CP} \text{ and}$$

$$\frac{dVD}{dt} = \frac{\hat{V}OLED - VD}{RP \times CD0(1 + aVD)e^{aVD}} - \frac{VD}{RD0 \times CD0(1 + aVD)}.$$

7. The method of claim 1, wherein the estimating comprises:
selecting P first parameter candidate vectors having fitness functions from N initial parameter candidate vectors, wherein the P and N are positive integers, and wherein N is greater than P;
selecting N-P second parameter candidate vectors on lines connecting the first parameter candidate vectors; and
selecting an optimal vector having the greatest fitness function from the first and second parameter candidate vectors.

8. The method of claim 7, wherein the estimating further comprises:
repetitively selecting the optimal vector having the greatest fitness function from the N initial parameter candidate vectors; and
determining a final vector from the optimal vectors.

9. The method of claim 5, wherein the physical characteristic of the OLED is a reverse saturation current ISO, and wherein the reverse saturation current ISO is $$IS0 = \frac{RD0}{a}.$$

10. The method of claim 5, wherein the physical characteristic is an ideal factor n, and wherein when k is the Boltzmann constant and T is an absolute temperature, the ideal factor n is $$n = \frac{1}{akT}.$$

11. The method of claim 5, wherein the physical characteristic is a carrier lifetime τm, and wherein the carrier lifetime τm is τm=RD0×CD0.

12. The method of claim 1, wherein the load resistor is electrically connected to the OLED in series so as to measure the OLED voltage and the OLED current.

13. An inspecting system of an organic light-emitting diode (OLED), the inspecting system comprising:
a load resistor electrically connected to the OLED in series;
a data collecting module configured to apply an input voltage to the OLED and measure an OLED voltage across the OLED and an OLED current flowing through the OLED using the load resistor, the load resistor being connected between the OLED and the data collecting module; and
a computer processor configured to i) estimate an OLED voltage, wherein the estimated OLED voltage is based at least in part on a parameter candidate vector, (ii) estimate a parameter of the OLED based at least in part on the OLED voltage and the OLED current measured, wherein estimating the parameter is based at least in part on a fitness function of a plurality of parameter candidate vectors, wherein the fitness function is defined as a difference between the measured OLED voltage and an estimated OLED voltage and ii) extract a physical characteristic of the based at least in part on the estimated parameter, wherein the processor is further configured to i) select P first parameter candidate vectors having fitness functions from N initial parameter candidate vectors, wherein P and N are positive integers, and wherein N is greater than P, ii) select N-P second parameter candidate vectors on lines connecting the first parameter candidate vectors, and iii) select an optimal vector having the greatest fitness function from the first and second parameter candidate vectors.

14. The inspecting system of claim 13, wherein a model of the OLED includes one or more resistors and one or more capacitors.

15. The inspecting system of claim 14, wherein the OLED includes an anode, a hole injecting layer formed over the anode, a hole transport layer formed over the hole injecting layer, a light emitting layer formed over the hole transport layer, an electron transport layer formed over the light emitting layer, an electron injecting layer formed over the electron transport layer and a cathode formed over the electron injecting layer, wherein each layer has a resistance, and wherein the OLED model includes i) a parasitic resistance RP electrically connected between a first node and a second node, ii) a diode resistance RD and a diode capacitance CD which are electrically connected in parallel between the second node and a third node, and iii) a parasitic capacitance CP electrically connected between the first node and the third node.

16. The inspecting system of claim 15, wherein the parasitic resistance RP is defined as the sum of the resistances of the hole injecting layer, the hole transport layer, the electron transport layer, and the electron injecting layer, wherein the parasitic capacitance CP is defined as a capacitance between the anode and the cathode, wherein the diode resistance RD is defined as a resistance of the light emitting layer, and wherein the diode capacitance CD is defined as a capacitance of the light emitting layer.

17. The inspecting system of claim 15, wherein the parameter includes a diode resistance constant RD0, a diode capacitance constant CD0, the parasitic resistance RP, the parasitic capacitance CP, and a characteristic value a, and wherein a voltage of the light emitting layer is VD, the diode resistance is $$RD = \frac{RD0}{e^{aVD}},$$

and the diode capacitance is $CD = CD0 \times e^{aVD}$.

18. The inspecting system of claim 13, wherein θi is the parameter candidate vector, t is time, IOLED is the measured OLED current, VOLED is the measured OLED voltage, and $\hat{V}$OLED is the estimated OLED voltage using the parameter candidate vector, and wherein the fitness function h is defined as $$h(\theta i, IOLED) = -\sum_t |VOLED(t, IOLED) - \hat{V}OLED(t, \theta i, IOLED)|^2.$$

* * * * *